(12) United States Patent
Kuwazawa

(10) Patent No.: US 6,462,370 B2
(45) Date of Patent: Oct. 8, 2002

(54) INTEGRATED CIRCUIT MEMORY DEVICES HAVING NON-VOLATILE MEMORY TRANSISTORS AND METHODS OF FABRICATING THE SAME

(75) Inventor: Kazunobu Kuwazawa, Sakata (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/945,159

(22) Filed: Aug. 31, 2001

(65) Prior Publication Data

US 2002/0048200 A1 Apr. 25, 2002

(30) Foreign Application Priority Data

Sep. 4, 2000 (JP) ........................................ 2000-266795

(51) Int. Cl.⁷ .................. H01L 27/108; H01L 27/76; H01L 29/94; H01L 31/119; H01L 29/788
(52) U.S. Cl. .................. 257/296; 257/316; 257/532; 257/640
(58) Field of Search ................................ 257/296, 316, 257/324, 532, 640

(56) References Cited

U.S. PATENT DOCUMENTS 5,104,819 A * 4/1992 Freiberger et al.
6,204,126 B1 * 3/2001 Hsieh et al. ................. 438/267
6,380,035 B1 * 4/2002 Sung et al. .................. 438/264

* cited by examiner

*Primary Examiner*—Ngân V. Ngô
(74) *Attorney, Agent, or Firm*—Hogan & Hartson, LLP

(57) ABSTRACT

An integrated circuit device is provided that has a split-gate type memory transistor, a first capacitor element and a second capacitor element formed on a common chip. The dielectric strength of each of the split-gate type memory transistor, the first capacitor element and the second capacitor element can be improved. An intermediate insulation film of the split-gate type memory transistor can include a thermal oxide film, an HTO film, a side-section insulation film, and another thermal oxide film. A dielectric film of the first capacitor element can include a thermal oxide film, an HTO film, and another thermal oxide film, while a dielectric film of the second capacitor element can include a thermal oxide film, an HTO film, a silicon nitride film, and another thermal oxide film.

22 Claims, 9 Drawing Sheets

INTEGRATED CIRCUIT MEMORY DEVICES HAVING NON-VOLATILE MEMORY TRANSISTORS AND METHODS OF FABRICATING THE SAME

BACKGROUND OF THE INVENTION

The present invention relates to integrated circuit memory devices, and more particularly, to non-volatile memory transistors used in integrated circuit memory devices, and to methods for fabricating the same.

Recently mixed-mounting of various types of circuits has been used for a variety of factors. For example, mixed-mounting of various types of circuits can reduce factors such as chip interface delay, cost per board area, and cost of design and development of boards.

SUMMARY OF THE PREFERRED IMPLEMENTATIONS

An aspect of the present invention provides integrated circuit devices that include an integrated circuit substrate, a first capacitor element, a second capacitor element, and a nonvolatile memory transistor. The non-volatile memory transistor, the first capacitor element and the second capacitor element are each formed the integrated circuit substrate. The first capacitor element comprises a first lower electrode, a first dielectric film composed of an oxide film, and a first upper electrode. The second capacitor element comprises a second lower electrode, a second dielectric film including an ONO film, and a second upper electrode. The non-volatile memory transistor comprises a floating gate, a control gate, and an intermediate insulation film located between the floating gate and the control gate. Each of the intermediate insulation film, the oxide film and the ONO film include an HTO film.

Another aspect of the present invention provides methods for manufacturing an integrated circuit device. A floating gate, a first lower electrode and a second lower electrode are formed on an integrated circuit substrate. A first thermal oxide film is formed over portions of the floating gate, the first lower electrode, and the second lower electrode. An HTO film is formed over the first thermal oxide film. A nitride film is formed to cover portions of the HTO film on the floating gate, on the first lower electrode, and on the second lower electrode. Portions of the nitride film are selectively removed to leave portions of the nitride film. A second thermal oxide film if formed over the HTO film on portions of the floating gate and the first lower electrode, and over the nitride film on portions of the second lower electrode. A control gate, a first upper electrode, and a sec upper electrode are then formed.

Another aspect of the present invention provides methods for manufacturing an integrated circuit device. A floating gate, a first lower electrode and a second lower electrode are formed on an integrated circuit substrate. A first thermal oxide film is formed over a side surface of the floating gate, an upper surface of the first lower electrode and an upper surface of the second lower electrode. The first thermal oxide film becomes a component of an intermediate insulation film, a component of a first dielectric film, and a component of a second dielectric film. An HTO film is formed over the first thermal oxide film. The HTO film becomes a component of the intermediate insulation film, a component of the first dielectric film and a component of the second dielectric film. A nitride film is formed over the HTO film located above the second lower electrode. The nitride film becomes a component of the second dielectric film. A second thermal oxide film is formed over the HTO film on the side surface of the floating gate, over the HTO film on the upper surface of the first lower electrode and over the nitride film on the upper surface of the second lower electrode. The second thermal oxide film becomes a component of the intermediate insulation film, a component of the first dielectric film and a component of the second dielectric film. A control gate, a first upper electrode and a second upper electrode are formed over the integrated circuit substrate.

Aspects of the present invention can thus provide integrated circuit devices having a non-volatile memory transistor and another device element that are mounted on the same integrated circuit substrate, and a method for manufacturing the same.

DETAILED DESCRIPTION OF PREFERRED EMBODIMENTS

Figure 1:
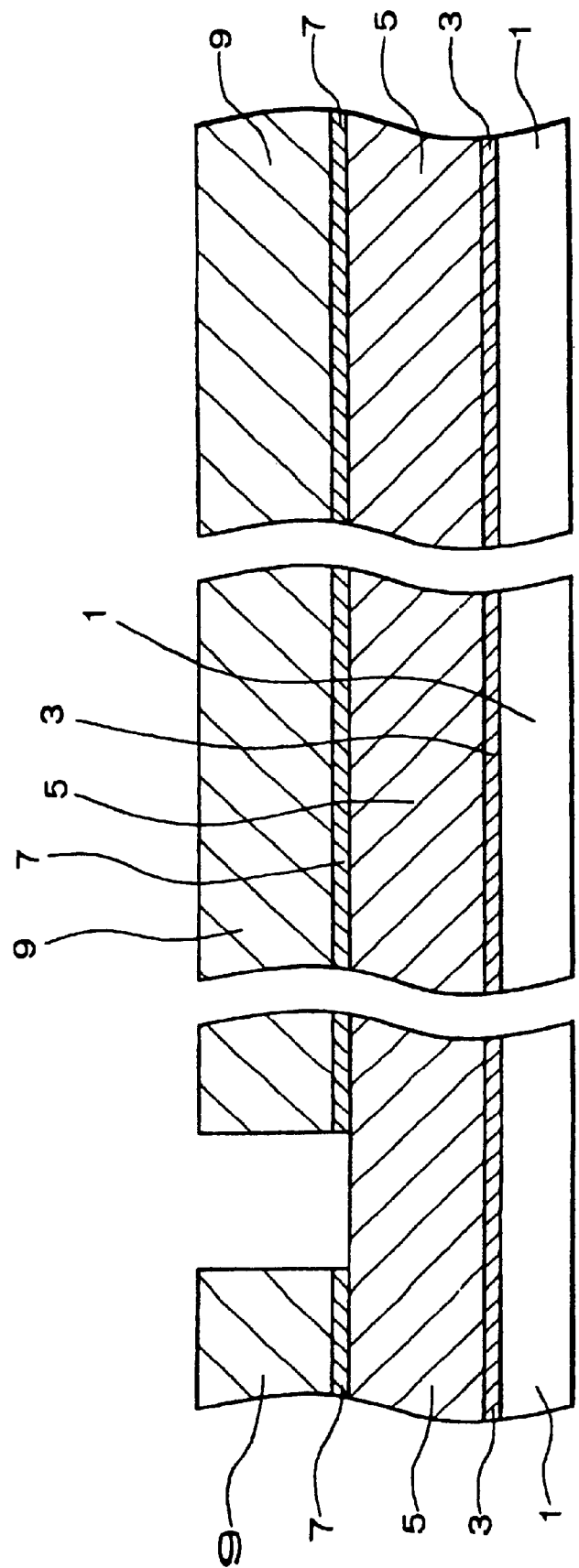
FIGS. 1–7 are cross-sectional views of a silicon substrate during various stages of manufacturing an integrated circuit device according to embodiments of the present invention.

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. As used herein the term integrated circuit can include semiconductor, semiconductor-on-insulator and other equivalent materials. Thus, an integrated circuit device can include, for example, semiconductor devices, semiconductor-on-insulator devices, and equivalents thereof. Similarly, an integrated circuit substrate can include, for example, various semiconductor substrates, various semiconductor-on-insulator substrates, and equivalents thereof. When ion implantation is described herein, one of ordinary skill will appreciate that other impurities and dosages could be utilized. The examples provided in this description are not restrictive, but exemplary only.

Embodiments of the present invention comprise integrated circuit devices that include an integrated circuit substrate, a first capacitor element, a second capacitor element, and a non-volatile memory transistor. The nonvolatile memory transistor, the first capacitor element and the second capacitor element are each formed the integrated circuit substrate. The first capacitor element comprises a first lower electrode, a first dielectric film composed of an oxide film, and a first upper electrode. The second capacitor element comprises a second lower electrode, a second dielectric film including an ONO film, and a second upper electrode. The non-volatile memory transistor comprises a floating gate, a control gate, and an intermediate insulation film located between the floating gate and the control gate. Each of the intermediate insulation film, the oxide film and the ONO film include an HTO film.

An HTO film is a silicon oxide film formed by a reduced pressure CVD method at relatively high temperatures. The HTO film is a dense film. As a result, according to the integrated circuit device of the present invention, the dielectric strength of the intermediate insulation film, the dielectric film and the other dielectric film can be improved. Also, since the components of the dielectric film and the other dielectric film are different from each other, the capacitor element and the other capacitor element can be made to have any desired capacitance values, independently from one another. It is noted that the intermediate insulation film is a film that functions, for example, as a tunnel insulation film when the non-volatile memory transistor operates. The oxide film is an insulation film including oxygen, such as, for example, a silicon oxide film. The non-volatile memory transistor is, for example, a flash cell. The same definitions apply to intermediate insulation films, oxide films and non-volatile memory transistors to be described below.

In further embodiments of the present invention, the first capacitor element and the second capacitor element can be, for example, components of an analog circuit. The nonvolatile memory transistor can be a split-gate type memory transistor.

In other embodiments of the present invention, the floating gate, the first lower electrode, and the second lower electrode can be films that are formed in a common step, while the control gate, the first upper electrode and the second upper electrode can also be films that are formed in a common step. As a result, the process for manufacturing integrated circuit devices can be simplified.

According to other embodiments of the present invention, the intermediate insulation film can have a structure including a first thermal oxide film, the HTO film and a second thermal oxide film in succession from the floating gate toward the control gate. The first dielectric film can have a structure including a first thermal oxide film, the HTO film and a second thermal oxide film in succession from the first lower electrode toward the first upper electrode. The second dielectric film can have a structure including a first thermal oxide film, the HTO film, a nitride film and a second thermal oxide film in succession from the second lower electrode toward the second upper electrode. Thus, the intermediate insulation film may have the three-layer structure described above, and may further include additional layers. The dielectric film may have the three-layer structure described above, and may further include an additional layer. The other dielectric film may have the four-layer structure described above, and may further include an additional layer. It is noted that the nitride film is an insulation film including nitrogen, for example, a silicon nitride film. The same definitions apply to nitride films to be described below.

In other embodiments of the present invention, the intermediate insulation film can include a nitride film located in a lower section of a sidewall of the floating gate and between the HTO film of the intermediate insulation film and the second thermal oxide film of the intermediate insulation film. The nitride film of the intermediate insulation film and the nitride film of the second dielectric film can be films that are formed in a common step. When a voltage (for example, a negative voltage) is applied to the control gate for the operation of the non-volatile memory transistor, an electric field may concentrate in a lower section of the sidewall of the floating gate. According to the embodiments described above, the dielectric strength of the intermediate insulation film can be improved.

In still other embodiments of the present invention, the intermediate insulation film can have a structure including only a first thermal oxide film, the HTO film and a second thermal oxide film in succession from the floating gate toward the control gate. The first dielectric film can have a structure including only a first thermal oxide film, the HTO film and a second thermal oxide film in succession from the first lower electrode toward the first upper electrode. The second dielectric film can also have a structure including only a first thermal oxide film, the HTO film, a nitride film and a second thermal oxide film in succession from the second lower electrode toward the second upper electrode. Thus, the intermediate insulation film can be formed only from the above-described three layers, and do not include another film. The dielectric film can be formed only from the above-described three layers, and does not include another film. The other dielectric film can be formed only from the above-described four layers, and does not include another film.

In further embodiments of the present invention, the first thermal oxide film of the intermediate insulation film, the first oxide film of the first dielectric film, and the first oxide film of the second dielectric film can be formed in a common step. The HTO film of the intermediate insulation film, the HTO film of the first dielectric film, and the HTO film of the second dielectric film can also be formed in a common step. The second thermal oxide film of the intermediate insulation film, the second thermal oxide film of the first dielectric film, and the second thermal oxide film of the second dielectric film are films can also be formed in a common step. As a result, the process for manufacturing integrated circuit devices can be simplified. Also, when field effect transistors are mixed-mounted on the same integrated circuit substrate, gate insulation films are simultaneously formed upon formation of the second thermal oxide.

According to other embodiments of the present invention, the control gate, the first upper electrode, and the second upper electrode can be electrodes composed of polysilicon, polycide, and/or salicide. When the control gate, the upper electrode and the other upper electrode are electrodes are composed of polycide or salicide, the resistance of the control gate, the upper electrode and the other upper electrode is lowered, and therefore the integrated circuit device can achieve a higher operation speed. The first upper electrode and the second upper electrode can also be composed of metal. When the upper electrode and the other upper electrode are electrodes composed of metal, the resistance of the upper electrode and the other upper electrode can be lowered, and therefore the integrated circuit device can achieve a higher operation speed. An impurity concentration of the second lower electrode can be different than an impurity concentration of the first lower electrode. By changing the impurity concentration, the capacitance value (i.e., capacitance value per unit area can be controlled. Therefore, a greater variety of combinations of the capacitance values of the capacitor element and the capacitance of the other capacitor element can be obtained.

In embodiments of the present invention, an area of the first upper electrode that faces the first dielectric film can be identical with or different from an area of the second upper electrode that faces the second dielectric film. The capacitance value per unit area of the first capacitor element can be identical to or different from the capacitance value per unit area of the second capacitor element. A film thickness of the second dielectric film can be identical to or different from a film thickness of the first dielectric film. As a result, the capacitance value of the first capacitor element can be made either the same or different from the capacitance value of the second capacitor element.

In other embodiments of the present invention, the first oxide film of each of the intermediate insulation film, the first dielectric film and the second dielectric film can each have a thickness grown by a method that grows a thermal oxide film on silicon to a thickness between 60 and 80 angstroms. The HTO film of each of the intermediate insulation film, the first dielectric film and the second dielectric film can each have a thickness between 100 and 200 angstroms. The second oxide film of each of the intermediate insulation film, the first dielectric film and the second dielectric film can each have a thickness grown by a method that grows a thermal oxide film on silicon to a thickness between 30 and 200 angstroms. The nitride film of the second dielectric film can have a thickness between 50 and 500 angstroms. The film thickness of the first dielectric film can be between 180 and 900 angstroms, and the film thickness of the second dielectric film can be between 340 and 1180 angstroms.

Embodiments of the present invention also relate to methods for fabricating integrated circuit devices. A floating gate, a first lower electrode and a second lower electrode are formed on an integrated circuit substrate. A first thermal oxide film is formed over portions of the floating gate, the first lower electrode, and the second lower electrode. An HTO film is formed over the first thermal oxide film. A nitride film is formed to cover portions of the HTO film on the floating gate, on the first lower electrode, and on the second lower electrode. Portions of the nitride film are selectively removed to leave portions of the nitride film. A second thermal oxide film if formed over the HTO film on portions of the floating gate and the first lower electrode, and over the nitride film on portions of the second lower electrode. A control gate, a first upper electrode, and a second upper electrode are then formed. Methods for manufacturing an integrated circuit device according to embodiments of the present invention, can allow a non-volatile memory transistor, a first capacitor and a second capacitor to be formed on one integrated circuit substrate. Also, the intermediate insulation film of the non-volatile memory transistor, the first dielectric film of the first capacitor element and the second dielectric film of the second capacitor element can be structured to have HTO films. Furthermore, the first dielectric film of the first capacitor element can be formed from stacked oxide films, and the second dielectric film of the second capacitor element can be formed from an ONO film.

Other embodiments provide methods of manufacturing an integrated circuit device in which a first conductive film is formed over an integrated circuit substrate. A mask can then be formed over the first conductive film. The mask can comprise, for example, a selective oxide film. The first conductive film can then be patterned to simultaneously form a floating gate, a first lower electrode and a second lower electrode on the integrated circuit substrate. An impurity can optionally be introduced in the first lower electrode to provide the first lower electrode with a first impurity concentration. Another impurity can then be introduced in the second lower electrode to provide the second lower electrode with a second impurity concentration that is different from the first impurity concentration. By changing the impurity concentration, the capacitance value can be controlled. Accordingly, more diversified combinations of a capacitance value of the first capacitor element and a capacitance value of the second capacitor element can be achieved. Introduction of an impurity refers to an ion implantation, an ion diffusion and the like.

A first thermal oxide film can be formed over a side surface of the floating gate, an upper surface of the first lower electrode and an upper surface of the second lower electrode, to become a component of an intermediate insulation film, a component of a first dielectric film, and a component of a second dielectric film, respectively. An HTO film that becomes a component of the intermediate insulation film, a component of the first dielectric film and a component of the second dielectric film can then be formed over the first thermal oxide film. A nitride film can then be formed by chemical vapor deposition, for example, to cover the HTO film on the side surface of the floating gate, the HTO film on the upper surface of the first lower electrode and the HTO film on the upper surface of the second lower electrode. Nitride films that become the component of the intermediate insulation film and the component of the other dielectric film can be simultaneously formed.

A mask film can then be formed over the nitride film on the second lower electrode. The nitride film can then be selectively removed using the mask film as a mask. For example, the nitride film can be anisotropically etched to thereby leave the nitride film that becomes a component of the intermediate insulation film and a component of the second dielectric film over the HTO film on the lower section of the sidewall of the floating gate, and over the HTO film on the second lower electrode, respectively.

A second thermal oxide film can then be formed over the HTO film on the side surface of the floating gate, over the HTO film on the upper surface of the first lower electrode, and over the nitride film on the upper surface of the second lower electrode, to become a component of the intermediate insulation film, a component of the first dielectric film, and a component of the second dielectric film, respectively. A second conductive film can then be formed over the integrated circuit substrate, and patterned to simultaneously form a control gate, a first upper electrode and a second upper electrode.

An integrated circuit device according to embodiments of the present invention and a method for manufacturing the same are described below with reference to the accompanying drawings. FIG. 8 shows a cross section of an integrated circuit device according to the present embodiment. The integrated circuit device of the present embodiments includes a split-gate type memory transistor 51 and two capacitor elements 53 and 55 that are formed in a common chip (integrated circuit substrate). FIGS. 1–7 are cross-sectional views showing a manufacturing method of an integrated circuit device shown in FIG. 8.

As shown in FIG. 1, a surface of an integrated circuit substrate 1 is preferably subject to a wet oxidation at temperatures of about 850° C., to thereby form a gate oxide film 3, which is one example of a gate insulation film, on the integrated circuit substrate 1. Then, a polycrystalline silicon film 5 can be deposited over the gate oxide film 3 by a reduced-pressure CVD (chemical vapor deposition) method to a film thickness of about 1200–1500 angstroms. The film thickness of the polycrystalline silicon film 5 is preferably greater than 1200 angstroms for a number of reasons described below.

A selective oxide film 11, described below, can be formed by the oxidation of the polycrystalline silicon film 5. Therefore, if the thickness of the polycrystalline silicon film 5 is smaller than, for example, 1200 angstroms, a floating gate 17, described below, cannot be formed to a specified film thickness.

Moreover, the film thickness of the polycrystalline silicon film 5 is preferably smaller than 1500 angstroms for a number of reasons described below.

When a silicon oxide film 25 is formed on a sidewall section of the floating gate 17 by a thermal oxidation step, described below, the silicon oxide film 25 does not sufficiently adhere to the sidewall section of the floating gate 17. As a result, the silicon oxide film 25 can become relatively thin. As a result, the dielectric strength of the silicon oxide film between the control gate and the floating gate can deteriorate. Thus, for the reasons described above, the thickness of the polycrystalline silicon film 5 is preferably made smaller than 1500 angstroms.

An anti-oxidation film 7 that is preferably composed of a silicon nitride film having a thickness of about 800–1000 angstroms can be deposited on the polycrystalline silicon film 5. A photoresist 9 can be coated on the anti-oxidation film 7, and the photoresist film 9 can be exposed to light and developed. An opening section can thus be formed in a region wherein a floating gate is to be formed. The anti-oxidation film 7 that is exposed through the opening can then be dry-etched, using the photoresist film 9 as a mask, to form an opening in the anti-oxidation film 7. The photoresist film 9 can then be removed.

Figure 2:
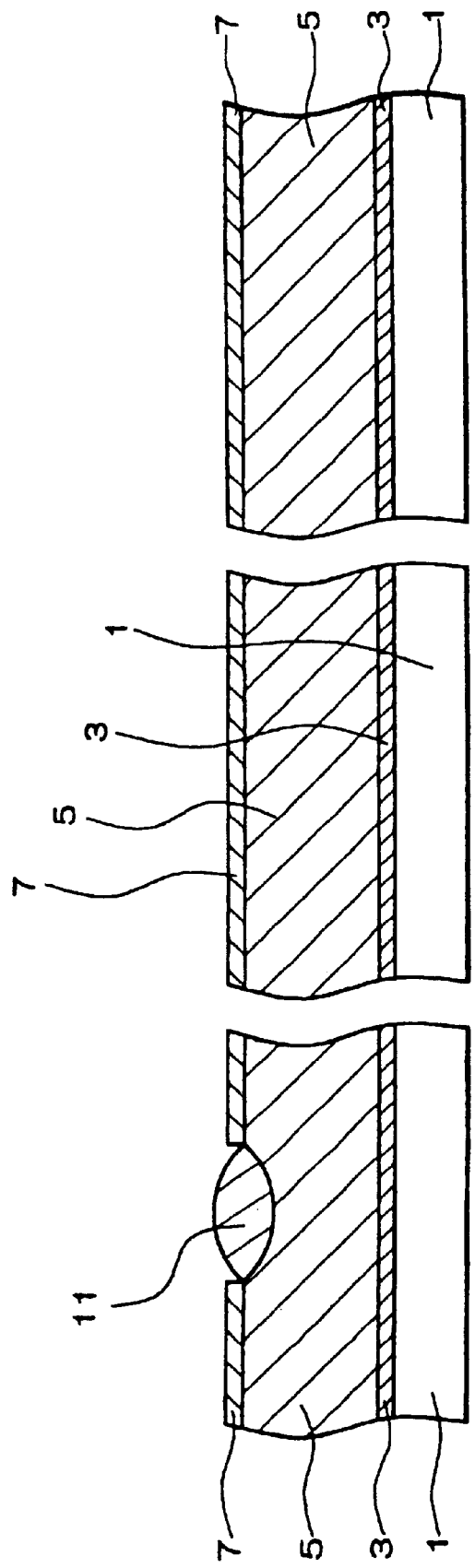

As shown in FIG. 2, the polycrystalline silicon film 5 exposed through the opening can be selectively oxidized, using the anti-oxidation film 7 as a mask, to form a selective oxide film 11 on the polycrystalline silicon film 5.

Figure 3:
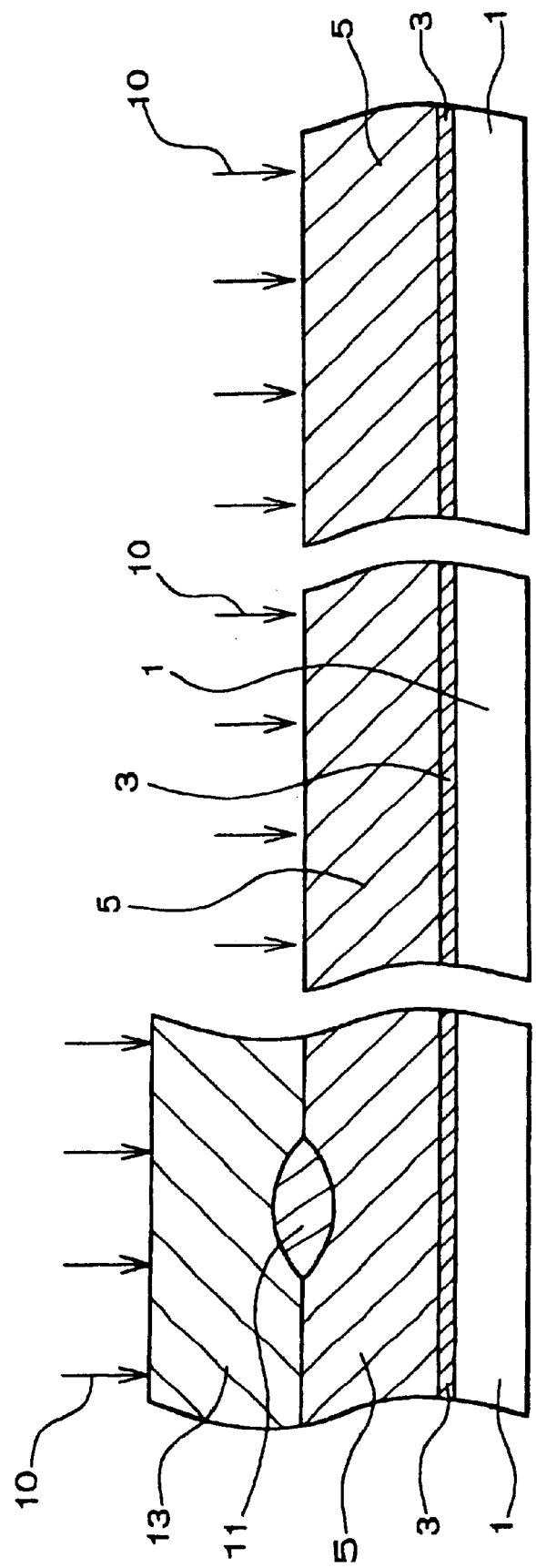

As shown in FIG. 3, the anti-oxidation film 7 can then be removed by, for example, a heated phosphoric acid. Other known film removal methods could be utilized. A photoresist film 13 can be coated on the selective oxide film 11 and the polycrystalline silicon film 5. The photoresist film 13 can then be exposed to light and developed. As a result, openings are formed in areas where capacitor elements 53 and 55 are to be formed.

Although any known implantation method could be utilized, an impurity is preferably ion-implanted in the polycrystalline silicon film 5 with a first dose using the photoresist film 13 as a mask. For example, the first dose could be a dose of $5 \times 10^{15}/cm^2$. The impurity 10 to be ion-implanted can be, for example, phosphorous. As a result, the impurity 10 can be introduced in the polycrystalline silicon film 5 in regions where the first and second capacitor elements 53 and 55 are to be formed. In the end product, the capacitance values can be controlled by changing the impurity concentration of the lower electrode.

Figure 4:
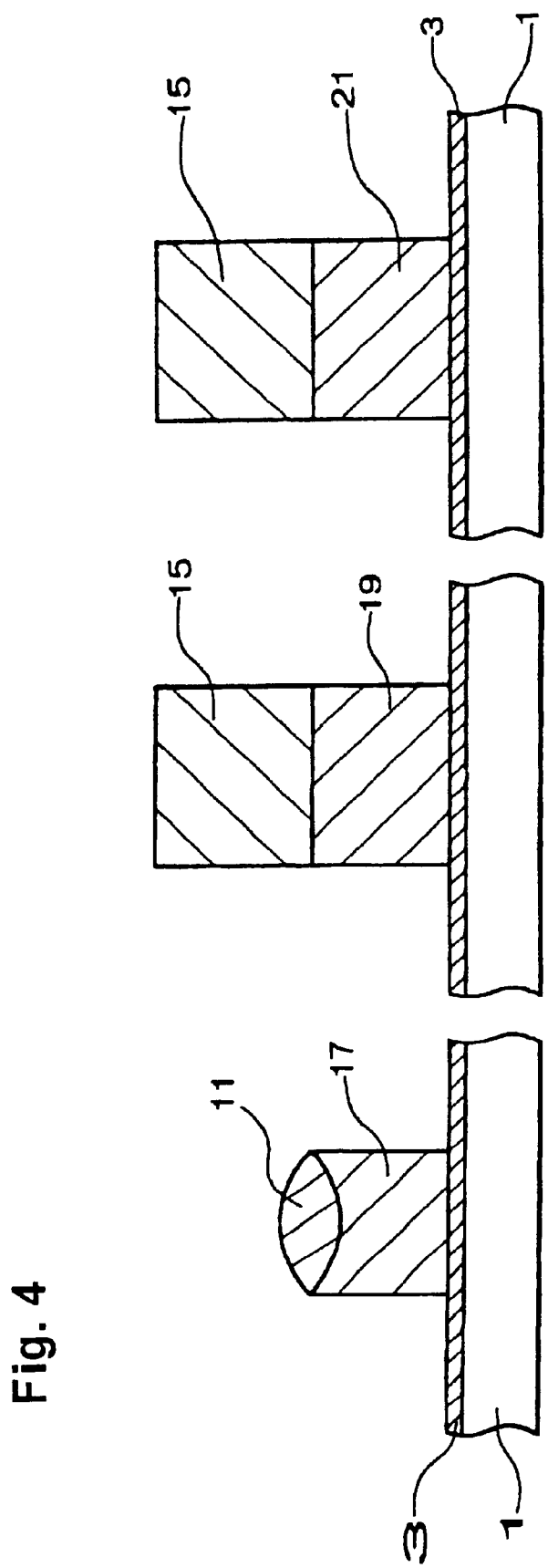

As shown in FIG. 4, after removing the photoresist film 13, a photoresist film 15 can be coated over the entire surface, and the photoresist film 15 can then be exposed to light and developed to form resist patterns 15 on regions where the capacitor elements are to be formed. The polycrystalline silicon film 5 can be then anisotropically etched in a vertical direction, using the resist pattern 15 and the selective oxide film 11 as a mask. Other known film removal methods could be utilized. As a result, a floating gate 17 is formed below the selective oxide film 11, and lower electrodes 19 and 21 of a first capacitor element and a second capacitor element can be formed under the photoresist films 15. An upper face area of the lower electrode 19 is preferably the same as an upper face area of the lower electrode 21.

Figure 5:
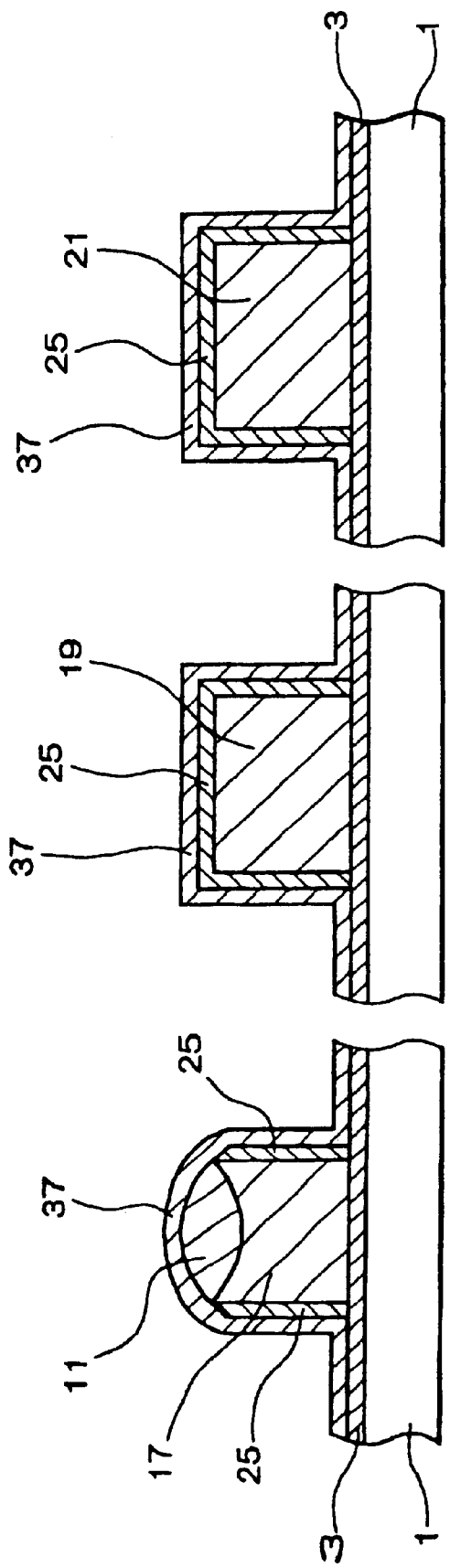

As shown in FIG. 5, the photoresist films 15 are removed. A silicon oxide film 25 having a thickness of about 60–80 angstroms can then be formed by, for example, a thermal oxidation on surfaces of the lower electrodes 19 and 21 of the capacitor elements and the sidewall of the floating gate 17. It can be difficult to grow an oxide film on the gate oxide film 3 and the thick selective oxide film 11. It is noted that the "thickness of about 60–80 angstroms" means a film thickness grown by a method in which a thermal oxide film having a thickness of about 60–80 angstrom will grow on silicon. Hereafter, the same definition applies to a film thickness that is obtained by a thermal oxidation.

A silicon oxide film (HTO film) 37 can be deposited over the entire surface including the silicon oxide film 25 and the selective oxide film 11 to a thickness of about 150 angstrom preferably by, for example, a high-temperature CVD method at temperatures of 750° C.–850° C. Other films and processing conditions could be implemented. The silicon oxide film (HTO film) 37 becomes dense because it is formed by a high-temperature CVD method. As a result, an intermediate insulation film of a split-gate type memory transistor 51 can exhibit an improved dielectric strength.

Figure 6:
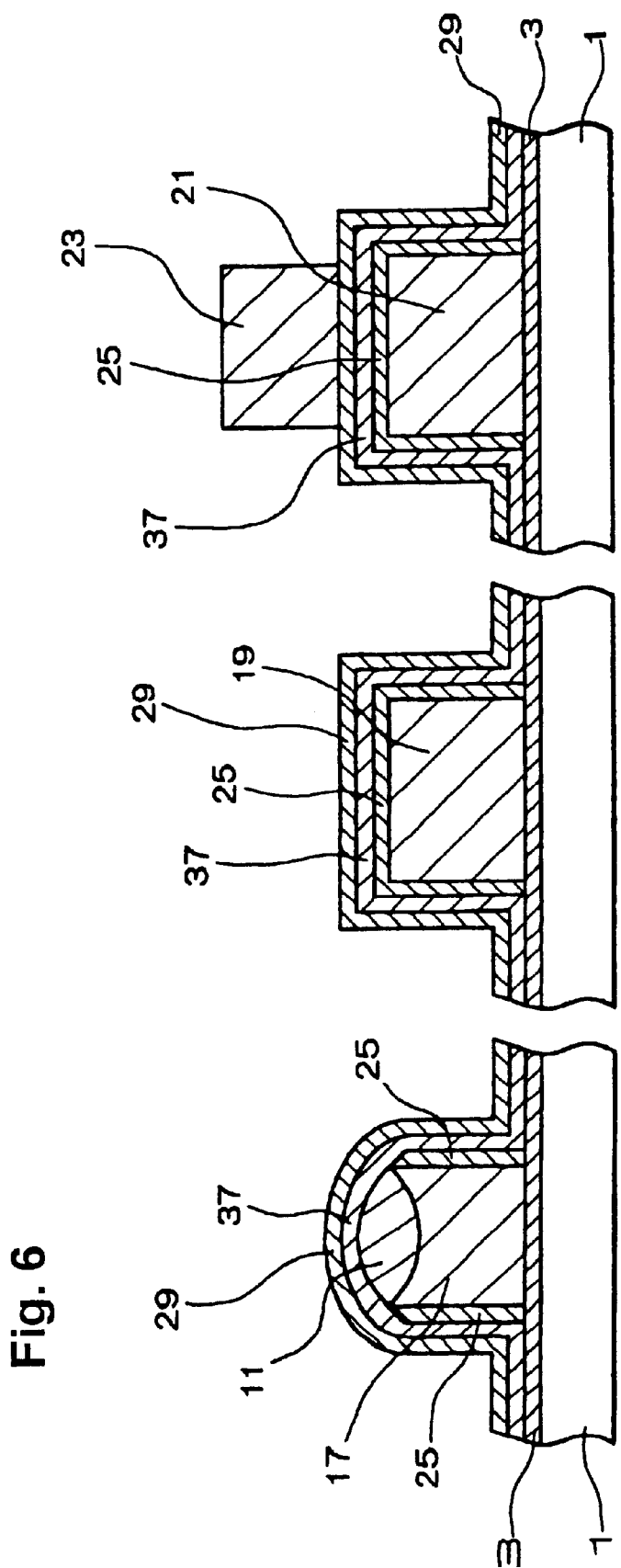

As shown in FIG. 6, a silicon nitride film 29 having a thickness of about 150 angstroms can be deposited on the silicon oxide film (HTO film) 37 by, for example, a CVD method. Other known film deposition methods could be utilized. A photoresist film 23 may then be coated on the silicon nitride film 29, and the photoresist film 23 is exposed to light and developed. As a result, the photoresist film 23 can be left on a region where the capacitor element 55 is to be formed.

Figure 7:
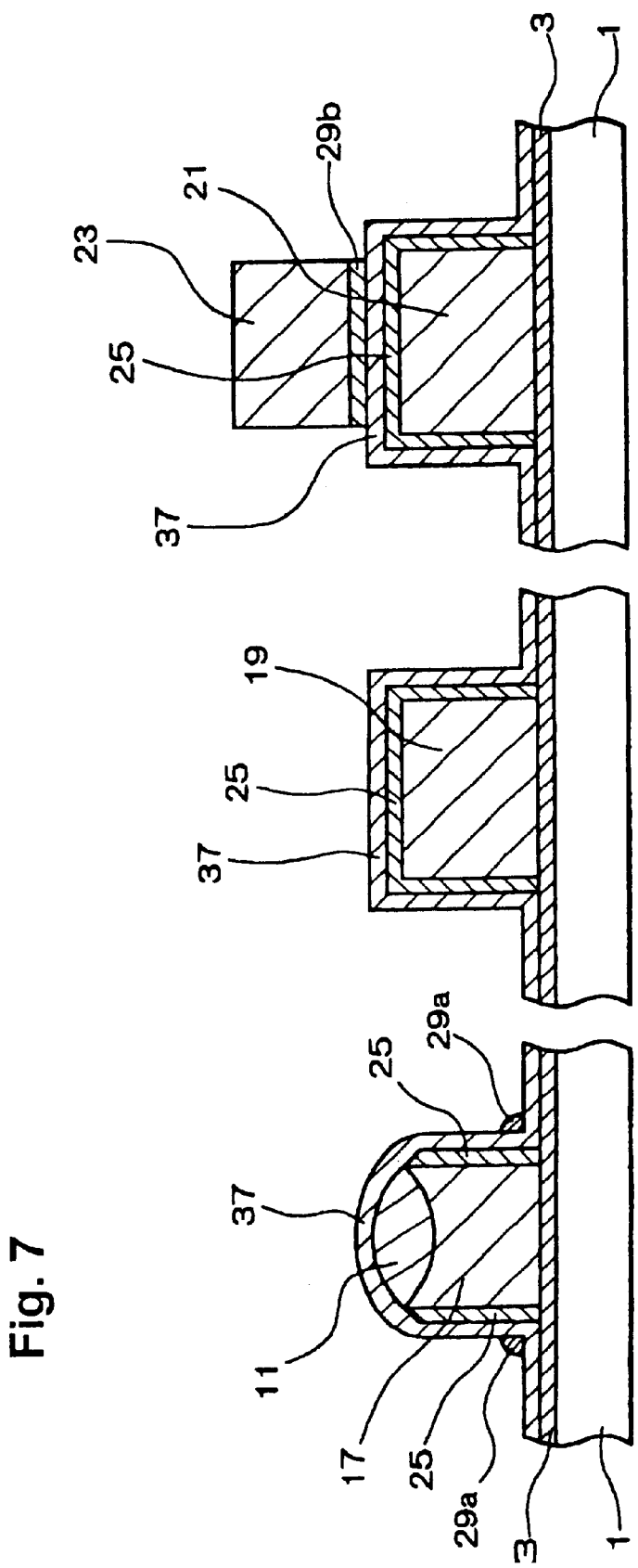
Figure 8:
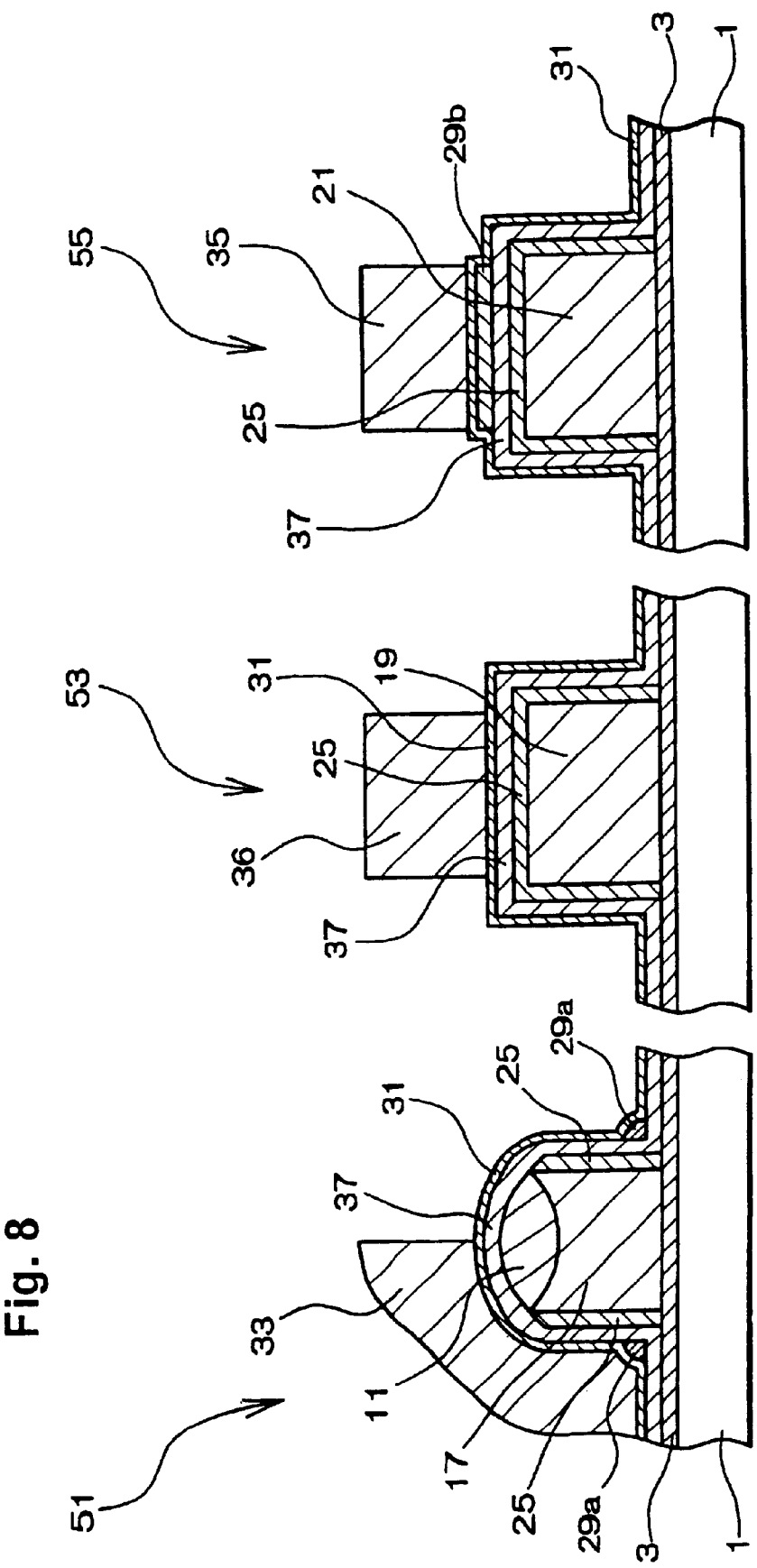
FIG. 8 is a cross-sectional view of an integrated circuit device according to embodiments of the present invention.

As shown in FIG. 7, the silicon nitride film 29 can then be anisotropically etched in a vertical direction, using the photoresist film 23 as a mask. Other known film removal methods could be utilized. As a result, a side-section insulation film 29a is formed on a lower section of the sidewall of the floating gate 17, and a silicon nitride film 29b is formed on the lower electrode 21.

As shown in FIG. 8, a silicon oxide film 31 can be deposited to a thickness of about 60–80 angstroms over the entire surface including the side-section insulation film 29a of the silicon nitride film, the silicon nitride film 29b and the silicon oxide film (HTO film) 37 by, for example, a thermal oxidation method. However, other deposition methods could be utilized.

A polycrystalline silicon film can then be deposited on the silicon oxide film 31 by a reduced-pressure CVD method. Phosphorous ions can be diffused in the polycrystalline silicon film in a $POCl_3$ atmosphere, and then the polycrystalline silicon film is patterned.

As a result, the polycrystalline silicon film remains in an area extending from a location on the selective oxide film 11 across one side section of the floating gate 17 to a location on the silicon substrate 1. The remaining polycrystalline silicon film serves as a control gate 33. The polycrystalline silicon film remains over the lower electrode 19 through the silicon oxide films 25, 37 and 31. The remaining polycrystalline silicon film serves as an upper electrode 36 of the capacitor element 53. Also, the polycrystalline silicon film remains over the lower electrode 21 through the silicon oxide films 25 and 37, the silicon nitride film 29b and the silicon oxide film 31. The remaining polycrystalline silicon film serves as an upper electrode 35 of the capacitor element 55.

An impurity can then be introduced in the silicon substrate 1 on both sides of the control gate 33 and the floating gate 17 to thereby form diffusion layers (not shown) for source and drain regions in the silicon substrate 1.

As shown in FIG. 8, the split-gate type memory transistor 51 and the first and second capacitor elements 53 and 55 can be readily mixed and mounted on the same silicon substrate 1. As a result, the number of chips can be reduced, compared to a conventional apparatus in which these device elements are formed on independent chips. Consequently, the product cost can be reduced.

The intermediate insulation film in the split-gate type memory transistor 51, the dielectric film of the first capacitor element 53 and the dielectric film of the second capacitor element 55 include the silicon oxide film (HTO films) 37, respectively. The HTO film is a dense film, and therefore can improve the dielectric strength of these films.

The first capacitor element 53 can be formed, in this example, from the lower electrode 19, the oxide films (the silicon oxide film 25, 37 and 31) as a dielectric film and the upper electrode 36. The second capacitor element 55 can be formed, in this example, from the lower electrode 21, the ONO film (the silicon oxide films 25 and 37, the silicon nitride film 29b and the silicon oxide film 31) as a dielectric film, and the upper electrode 35. In this manner, the dielectric film of the second capacitor element 55 can include a component (the silicon nitride film 29b) that is different from those of the dielectric film of the first capacitor element 53. Therefore, in this example, the capacitance values of the first capacitor element 53 and the second capacitor element 55 can each be set to a wide range of desired values.

The dielectric film of the second capacitor element 55 can contain components different from those of the dielectric film of the first capacitor element 53 because the silicon nitride film 29b is left in a region where the second capacitor element 55 can be formed as shown in FIG. 7. Furthermore, the second capacitor element 55 can be formed with the ONO film as a dielectric film because the silicon nitride film 29b is preferably formed over the lower electrode through the silicon oxide film 25 and 37 at the same time when the sidesection insulation film 29a composed of a silicon nitride film is formed on the lower section of the sidewall of the floating gate 17 as shown in FIG. 7.

An area of the upper electrode 35 that faces the dielectric film can be the same as an area of the upper electrode 36 that faces the dielectric film. The dielectric film of the first capacitor element 53 can contain components different from those of the second capacitor element 55. When this is the case, the capacitance value of the first capacitor element 53 is different from the capacitance value of the second capacitor element 55. An area of the upper electrode 35 that faces the dielectric film may be made different from an area of the upper electrode 36 that faces the dielectric film.

When a circuit including a field effect transistor, for example, an SRAM is mixed and mounted on the silicon substrate 1, a gate oxide film of the filed effect transistor can be formed when the silicon oxide film 31 is formed.

A comparative example of a sample capacitor element A and a sample capacitor element B will now be described and compared following a brief description of the method of preparation of each of the capacitor elements.

Sample A

Sample capacitor element A was prepared as follows. A lower electrode composed of a polycrystalline silicon film having a thickness of 1200 angstrom is formed. An upper surface of the lower electrode defines a square with the length of each edge being 3200 angstrom. Phosphorous is ion-implanted in the lower electrode with an acceleration voltage of 35 KeV. After the ion-implantation, the lower electrode is thermally oxidized at 750° C., to thereby form a thermal silicon oxide film on the lower electrode. A silicon nitride film having a thickness of 150 angstrom is formed on the thermal silicon oxide film. A thermal silicon oxide film is formed on the silicon nitride film by thermally oxidizing the silicon nitride film at 750° C. An upper electrode composed of a polycrystalline silicon film having a thickness of 2500 angstrom is formed on the thermal silicon oxide film. The impurity implantation is conducted with three different impurity amounts (doses), i.e., $4.5 \times 10^{15}/cm^2$, $6 \times 10^{15}/cm^2$, and $8 \times 10^{15}/cm^2$.

Sample B

Sample capacitor element B was prepared as follows. A lower electrode composed of a polycrystalline silicon film having a thickness of 1700 angstrom is formed. An upper surface of the lower electrode defines a square with the length of each edge being 3200 angstrom. Phosphorous is ion-implanted in the lower electrode with an acceleration voltage of 35 KeV. After the ion-implantation, the lower electrode is thermally oxidized at 1000° C., to thereby form a thermal silicon oxide film on the lower electrode. A silicon nitride film having a thickness of 150 angstrom is formed on the thermal silicon oxide film. A thermal silicon oxide film is formed on the silicon nitride film by thermally oxidizing the silicon nitride film at 750° C. An upper electrode composed of a polycrystalline silicon film having a thickness of 2500 angstrom is formed on the thermal silicon oxide film. The impurity implantation is conducted with three different impurity amounts (doses), i.e., $4.5 \times 10^{15}/cm^2$, $6 \times 10^{15}/cm^2$, and $8 \times 10^{15}/cm^2$.

Figure 9:
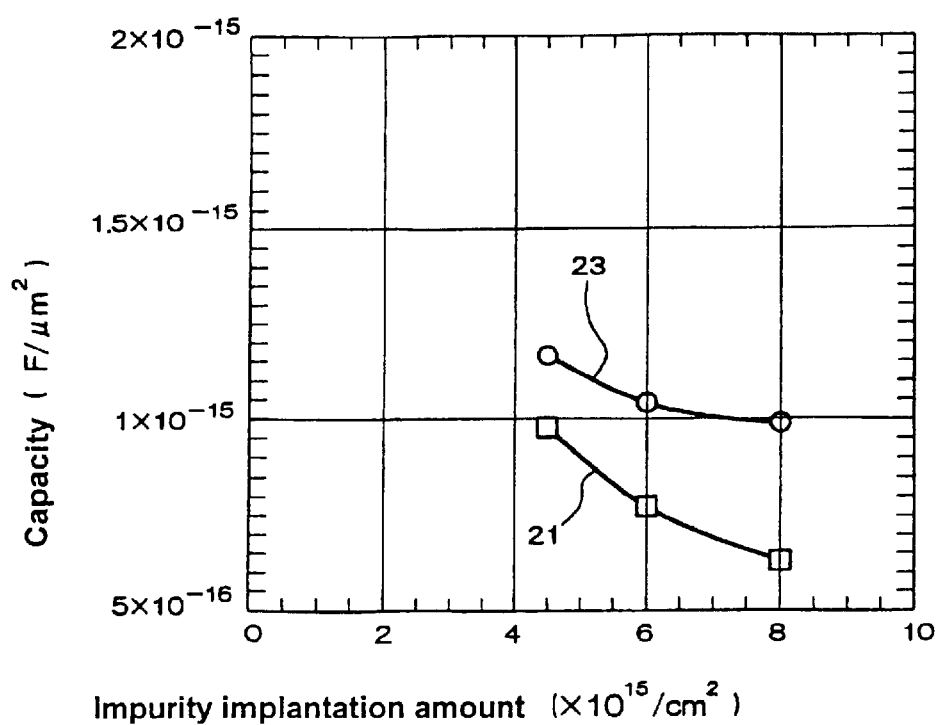
FIG. 9 is a graph showing the relationship between impurity implantation amount that is introduced in a lower electrode and capacitance value.

FIG. 9 shows a graph showing the relation between the implanting amount (dose) of the impurity that is introduced in the lower electrode and the capacitance value. In both Sample A and Sample B, as the implanting amount of the impurity that is introduced in the lower electrode increases (in other words, as the impurity concentration in the lower electrode becomes higher), the capacitance value decreases. In both Sample A and Sample B, as the implanting amount of the impurity that is introduced in the lower electrode decreases (in other words, as the impurity concentration in the lower electrode becomes lower), the capacitance value increases. From the above, it was observed that the capacitance value can be controlled by changing the impurity concentration in the lower electrode. Accordingly, by the application of the features described above, the capacitor element can be provided with a wider range of different capacitance values.

Notably, the control gate 33 and the upper electrodes 35 and 36 can be formed from a polycrystalline silicon film. However, the control gate 33 and the upper electrodes 35 and 36 can also be formed from a polycide film having a two-layered structure that includes a silicide (such as, for example, a titanium silicide, tungsten silicide, cobalt silicide and the like) and/or polycrystalline silicon. The control gate 33 and the upper electrodes 35 and 36 may also be formed from a salicide. As a result, the resistance value of the control gate 33 and the upper electrodes 35 and 36 can be lowered, and a higher operation speed can be achieved. The upper electrodes 35 and 36 may be formed from a metal, such as, for example, tungsten, aluminum and/or copper.

Figure 10:
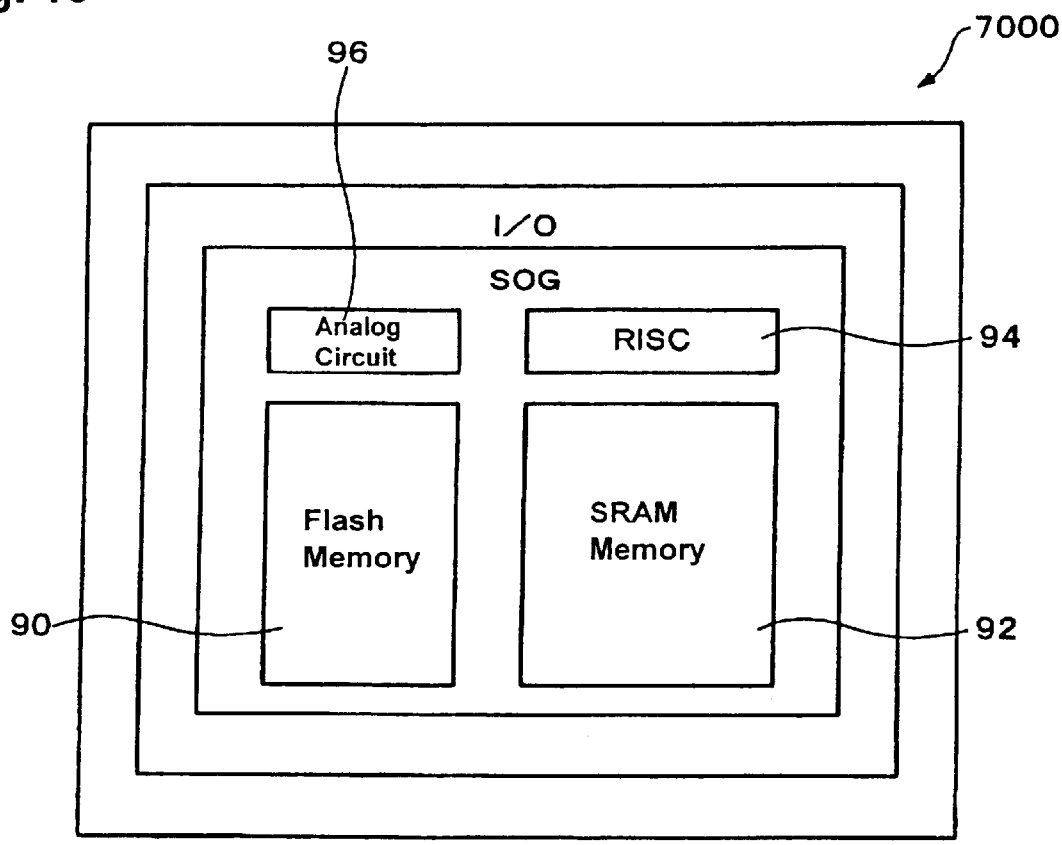
FIG. 10 schematically shows a layout of an embedded integrated circuit device in which an integrated circuit device of FIG. 8 is applied.

FIG. 10 schematically shows a layout of an embedded integrated circuit device 7000 to which integrated circuit devices such as those described above can be applied. In this example, the embedded integrated circuit device 7000 is preferably mounted with a mixture of a flash memory 90, an SRAM memory 92, a RISC 94 and an analog circuit 96 in an SOG (Sea of Gates). The split-gate type memory transistor 51 can be a component of the flash memory 90. The capacitor elements 53 and 55 can be components of the analog circuit 96.

The present invention can thus provide an integrated circuit device having a non-volatile memory transistor and another device element that are mounted on the same integrated circuit substrate, and a method for manufacturing the same. As a result, the number of chips can be reduced, compared to a conventional apparatus in which these device elements are formed on independent chips. Consequently, the product cost can be reduced.

Moreover, the intermediate insulation film in the split-gate type memory transistor, the dielectric film of the first capacitor element and the dielectric film of the second capacitor element can include the silicon oxide film (HTO films) 37, respectively. The HTO film is a dense film, and therefore can improve the dielectric strength of these films.

In the drawings and specification, there have been disclosed typical preferred embodiments of the invention and, although specific terms are employed, they are used in a generic and descriptive sense only and not for purposes of limitation, the scope of the invention being set forth in the following claims. Although the invention has been described with reference to a particular embodiment, it will be apparent to one of ordinary skill in the art that modifications of the described embodiment may be made without departing from the spirit and scope of the invention.

That which is claimed is:

1. An integrated circuit device, comprising:
    an integrated circuit substrate;
    a first capacitor element comprising a first lower electrode, a first dielectric film composed of an oxide film, and a first upper electrode;
    a second capacitor element comprising a second lower electrode, a second dielectric film including an ONO film, and a second upper electrode; and
    a non-volatile memory transistor comprising a floating gate, a control gate, and an intermediate insulation film located between the floating gate and the control gate,
    wherein the non-volatile memory transistor, the first capacitor element and the second capacitor element are each formed the integrated circuit substrate, and wherein each of the intermediate insulation film, the oxide film and the ONO film include an HTO film.

2. An integrated circuit device according to claim 1, wherein
    the intermediate insulation film has a structure including a first thermal oxide film, the HTO film and a second thermal oxide film in succession from the floating gate toward the control gate,
    the first dielectric film has a structure including a first thermal oxide film, the HTO film and a second thermal oxide film in succession from the first lower electrode toward the first upper electrode, and
    the second dielectric film has a structure including a first thermal oxide film, the HTO film, a nitride film and a second thermal oxide film in succession from the second lower electrode toward the second upper electrode.

3. An integrated circuit device according to claim 2, wherein
the intermediate insulation film includes a nitride film located in a lower section of a sidewall of the floating gate and between the HTO film of the intermediate insulation film and the second thermal oxide film of the intermediate insulation film.

4. An integrated circuit device according to claim 3, wherein the nitride film of the intermediate insulation film and the nitride film of the second dielectric film are films that are formed in a common step.

5. An integrated circuit device according to claim 1, wherein
    the intermediate insulation film has a structure including only a first thermal oxide film, the HTO film and a second thermal oxide film in succession from the floating gate toward the control gate,
    the first dielectric film has a structure including only a first thermal oxide film, the HTO film and a second thermal oxide film in succession from the first lower electrode toward the first upper electrode, and
    the second dielectric film has a structure including only a first thermal oxide film, the HTO film, a nitride film and a second thermal oxide film in succession from the second lower electrode toward the second upper electrode.

6. An integrated circuit device according to claim 5, wherein
    the first thermal oxide film of the intermediate insulation film, the first oxide film of the first dielectric film and the first oxide film of the second dielectric film are films that are formed in a common step,
    the HTO film of the intermediate insulation film, the HTO film of the first dielectric film and the HTO film of the second dielectric film are films that are formed in a common step, and
    the second thermal oxide film of the intermediate insulation film, the second thermal oxide film of the first dielectric film and the second thermal oxide film of the second dielectric film are films that are formed in a common step.

7. An integrated circuit device according to claim 6, wherein
    the first oxide film of each of the intermediate insulation film, the first dielectric film and the second dielectric film each have a thickness grown by a method that grows a thermal oxide film on silicon to a thickness between 60 and 80 angstroms,
    the HTO film of each of the intermediate insulation film, the first dielectric film and the second dielectric film each have a thickness between 100 and 200 angstroms, and
    the second oxide film of each of the intermediate insulation film, the first dielectric film and the second dielectric film each have a thickness grown by a method that grows a thermal oxide film on silicon to a thickness between 30 and 200 angstroms.

8. An integrated circuit device according to 7, wherein the nitride film of the second dielectric film has a thickness between 50 and 500 angstroms.

9. An integrated circuit device according to claim 8, wherein the control gate, the first upper electrode and the second upper electrode are electrodes composed of polysilicon.

10. An integrated circuit device according to claim 8, wherein the control gate, the first upper electrode and the second upper electrode are electrodes composed of polycide.

11. An integrated circuit device according to claim 8, wherein the first upper electrode and the second upper electrode are electrodes composed of metal.

12. An integrated circuit device according to claim 8, wherein the control gate, the first upper electrode and the second upper electrode are electrodes composed of salicide.

13. An integrated circuit device according to claim 12, wherein
   the floating gate, the first lower electrode and the second lower electrode are films that are formed in a common step, and
   the control gate, the first upper electrode and the second upper electrode are films that are formed in a common step.

14. An integrated circuit device according to claim 13, wherein an area of the first upper electrode that faces the first dielectric film is identical with an area of the second upper electrode that faces the second dielectric film.

15. An integrated circuit device according to claim 13, wherein an area of the first upper electrode that faces the first dielectric film is different from an area of the second upper electrode that faces the second dielectric film.

16. An integrated circuit device according to claim 15, wherein the capacitance value per unit area of the first capacitor element is different from the capacitance value per unit area of the second capacitor element.

17. An integrated circuit device according to claim 16, wherein a film thickness of the second dielectric film is different from a film thickness of the first dielectric film.

18. An integrated circuit device according to claim 17, wherein the film thickness of the first dielectric film is between 180 and 900 angstroms, and the film thickness of the second dielectric film is between 340 and 1180 angstroms.

19. An integrated circuit device according to claim 18, wherein an impurity concentration of the second lower electrode is different than an impurity concentration of the first lower electrode.

20. An integrated circuit device according to claim 19, wherein the first capacitor element and the second capacitor element are components of an analog circuit.

21. An integrated circuit device according to claim 20, wherein the non-volatile memory transistor includes a split-gate type memory transistor.

22. An integrated circuit device formed by a process comprising:
   forming a floating gate, a first lower electrode and a second lower electrode on an integrated circuit substrate;
   forming a first thermal oxide film over a side surface of the floating gate, an upper surface of the first lower electrode, and an upper surface of the second lower electrode, wherein the first thermal oxide film over the side surface of the floating gate, the upper surface of the first lower electrode, and the upper surface of the second lower electrode become a component of an intermediate insulation film, a component of a first dielectric film, and a component of a second dielectric film, respectively;
   forming an HTO film over the first thermal oxide film, wherein the HTO film over the first thermal oxide film becomes a component of the intermediate insulation film, a component of the first dielectric film, and a component of the second dielectric film;
   forming a nitride film over the HTO film located above the second lower electrode, wherein the nitride film over the HTO film located above the second lower electrode becomes a component of the second dielectric film;
   forming a second thermal oxide film over the HTO film on the side surface of the floating gate, over the HTO film on the upper surface of the first lower electrode, and over the nitride film on the upper surface of the second lower electrode, wherein the second thermal oxide film over the HTO film on the side surface of the floating gate, over the HTO film on the upper surface of the first lower electrode, and over the nitride film on the upper surface of the second lower electrode becomes a component of the intermediate insulation film, a component of the first dielectric film and a component of the second dielectric film, respectively; and
   then forming a control gate, a first upper electrode and a second upper electrode over the integrated circuit substrate;
   wherein the integrated circuit device comprises:
      a first integrated circuit substrate;
      a first capacitor element comprising the first lower electrode, the first dielectric film composed of the oxide film, and the first upper electrode;
   a second capacitor element comprising the second lower electrode, the second dielectric film including the ONO film, and the second upper electrode; and
      a non-volatile memory transistor comprising the floating gate, the control gate, and the intermediate insulation film located between the floating gate and the control gate, wherein the non-volatile memory transistor, the first capacitor element and the second capacitor element are each formed on the first integrated circuit substrate, and wherein each of the intermediate insulation film, the oxide film and the ONO film include the HTO film.

* * * * *